US011143676B2

(12) United States Patent
Tramet et al.

(10) Patent No.: US 11,143,676 B2
(45) Date of Patent: Oct. 12, 2021

(54) ELEMENT OF AN ELECTRIC EQUIPMENT CASING, IN PARTICULAR COMPRISING U-SHAPED MAGNETIC PARTS

(71) Applicant: Valeo Siemens eAutomotive France SAS, Cergy (FR)

(72) Inventors: Guillaume Tramet, Montesson (FR); Arnaud Mas, Cergy (FR)

(73) Assignee: Valeo Siemens eAutomotive France SAS, Cergy (FR)

( * ) Notice: Subject to any disclaimer, the term of this patent is extended or adjusted under 35 U.S.C. 154(b) by 0 days.

(21) Appl. No.: 16/223,130

(22) Filed: Dec. 18, 2018

(65) Prior Publication Data

US 2019/0195920 A1   Jun. 27, 2019

(30) Foreign Application Priority Data

Dec. 22, 2017 (FR) ...................................... 1762967

(51) Int. Cl.
| | |
|---|---|
| *G01R 15/20* | (2006.01) |
| *H05K 7/14* | (2006.01) |
| *B60R 16/023* | (2006.01) |
| *G01R 19/00* | (2006.01) |

(Continued)

(52) U.S. Cl.
CPC ........ *G01R 15/202* (2013.01); *B60R 16/0239* (2013.01); *G01R 19/0092* (2013.01); *H05K 5/0047* (2013.01); *H05K 5/0247* (2013.01); *H05K 7/1432* (2013.01)

(58) Field of Classification Search
CPC .............. G01R 15/202; G01R 19/0092; H05K 7/1432; H05K 5/0047; H05K 5/0247
See application file for complete search history.

(56) References Cited

U.S. PATENT DOCUMENTS 5,343,143 A * 8/1994 Voisine ................ G01R 11/067
324/107
5,583,429 A   12/1996 Otaka
(Continued)

FOREIGN PATENT DOCUMENTS

| EP | 2584690 A1 | 4/2013 |
|---|---|---|
| EP | 2916634 A2 | 9/2015 |
| WO | 2017081255 A1 | 5/2017 |

OTHER PUBLICATIONS

French Search Report for French Application No. 1762967.

*Primary Examiner* — Dominic E Hawkins

(74) *Attorney, Agent, or Firm* — JCIP; Joseph G. Chu; Jeremy I. Maynard

(57) ABSTRACT

The invention relates to a casing element of a first equipment, said casing element being configured to house at least one electrical conductor configured to receive an electric current, said casing element being notable in that it comprises a pair of slots provided in a wall of the casing element, the pair of slots comprising a slot on either side of a reception area configured to house said electrical conductor, and said pair of slots being provided to allow the insertion of a part with a U-shaped section, comprising a base and two arms parallel to one another and orthogonal to the base, said arms being configured to be inserted in said slots on either side of said reception area, so that the part is able to guide a magnetic flux generated by an electric current circulating in said electrical conductor.

8 Claims, 4 Drawing Sheets

Figure 1:
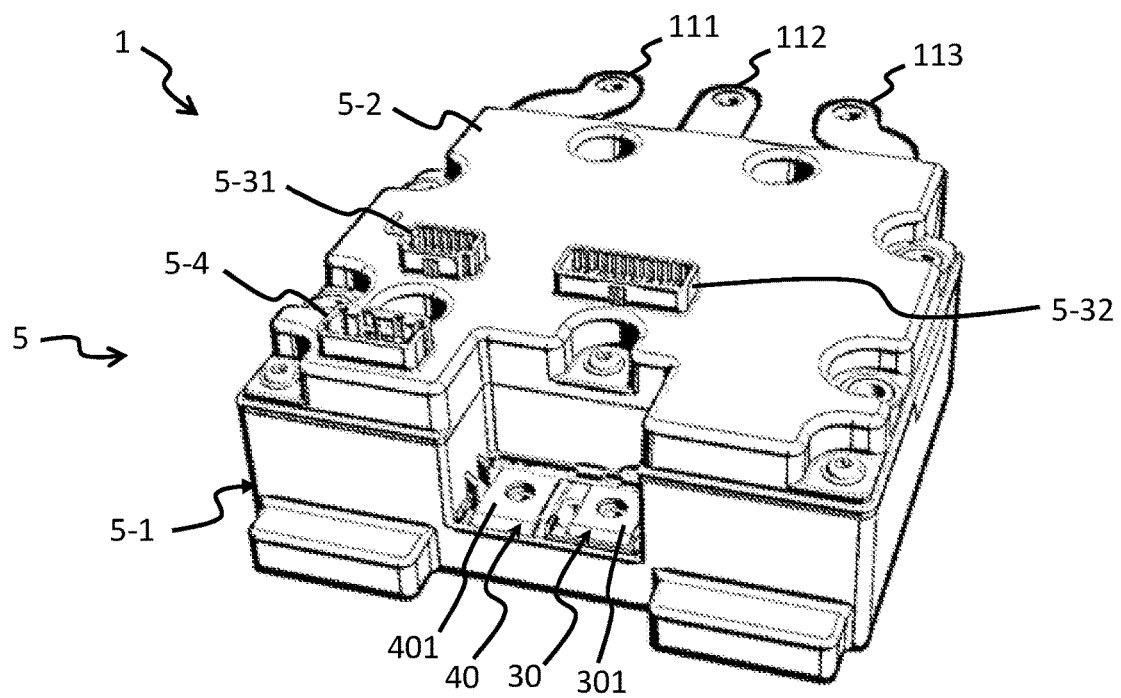

(51) Int. Cl.
*H05K 5/00* (2006.01)
*H05K 5/02* (2006.01)

(56) References Cited

U.S. PATENT DOCUMENTS

| | | | |
|---|---|---|---|
| 8,408,922 B2* | 4/2013 | Yamamoto | H01R 13/41 439/78 |
| 2005/0068749 A1* | 3/2005 | Watanabe | G11B 25/10 361/752 |
| 2006/0007721 A1* | 1/2006 | Rodriguez | H02M 7/003 363/146 |
| 2009/0163085 A1* | 6/2009 | Makino | H01R 43/20 439/701 |
| 2017/0326820 A1* | 11/2017 | Fujioka | B32B 27/34 |

* cited by examiner

ELEMENT OF AN ELECTRIC EQUIPMENT CASING, IN PARTICULAR COMPRISING U-SHAPED MAGNETIC PARTS

RELATED APPLICATIONS

This application claims priority to, and the benefits of, French Patent Application No. 1762967 filed on Dec. 22, 2017, the content of which is incorporated in its entirety herein.

TECHNICAL FIELD

The present invention relates to an element of a casing for an electric equipment, in particular of an electric and hybrid vehicle.

The invention relates to the field of high-voltage electric equipment for electric and hybrid vehicles.

In particular, the purpose of the invention is to allow an assembly adapted to the mass production of U-shaped magnetic parts on a casing element of an electric equipment for vehicle.

BACKGROUND

As is well known, an electric or hybrid automotive vehicle includes an electric motorisation system powered by a high-voltage power battery through an on-board high-voltage electrical system and a plurality of auxiliary electrical installations, which are powered by a low-voltage battery through an on-board low-voltage electrical system.

The high-voltage power battery powers the electric motorisation system, thereby providing for the vehicle's propulsion. More specifically, in order to control the electric device driving the wheels of the vehicle, the use of an inverter enabling the conversion of the direct current provided by the high-voltage power battery into one or several alternating control currents, for example sinusoidal currents, is known.

In a known solution, the inverter is in the form of casing on which are mounted an electronic power module and an electronic control unit. The inverter comprises a body comprising the electric components through which the power driving the electric motor passes. The electronic control unit comprises electronic components enabling to control the electronic power module.

For the purpose of connecting the electronic power module to the high-voltage battery, the electronic power module comprises an electrical conductor called "with positive potential" connected to the positive potential of the high-voltage power battery, and an electrical conductor called "with negative potential" connected to the negative potential of the high-voltage power battery.

Furthermore, in the case of a three-phase motor, the inverter comprises three electrical conductors, called "phase conductors", enabling to connect the electronic power module to the electric motor to control the motor by using three currents, called "phase currents", with a two-by-two phase change, for example of 120°, generated by the inverter from the direct current supplied by the high-voltage battery.

To control, in a suitable manner, the current transferred to an electrical device through these phase conductors, the intensity of the currents that circulates therein must be measured, by means of adapted sensors, in particular Hall effect sensors.

To enable the Hall effect sensors to measure the intensity of the currents circulating in the phase conductors, a known method is to provide members that focus the magnetic field produced by said currents. This magnetic field is measured by the corresponding Hall effect sensor, mounted on the electronic control unit. Based on the magnetic field, said sensor measures the intensity of the current circulating in the conductor.

According to the state of the art, said magnetic field focusing members are overmoulded on the phase conductors. A first disadvantage of this system is the cost induced by such overmoulding operations in the context of mass production. A second disadvantage is that the overmoulding generates a thermal shock that affects the member configured for focusing the magnetic field. This thermal shock causes a deterioration of the performance of said magnetic field focusing members by causing a disorganisation of the orientation of the molecules constituting the material of said members.

According to the state of the art, the solution consists in changing the settings of the current sensors to empirically change the measured values.

There therefore exists a need for a positioning of a magnetic field focusing member able to provide the focusing function of the magnetic fields generated by at least one electrical conductor of an electric equipment, in particular to perform direct and reliable measurements of the intensity of the current circulating in said electrical conductor.

For this purpose, the present invention relates to an element of a casing comprising an area housing at least one electrical conductor and at least a pair of slots configured to be located on either side of said electrical conductor, into which are inserted the flat arms of a part with a U-shaped section, said arms being configured to provide a focusing function of the magnetic field generated by the current circulating in said electrical conductor.

SUMMARY

For this purpose, the invention first relates to an element of a casing of a first electric equipment, in particular of an electric or hybrid vehicle, said casing element being configured to house at least one electric conductor provided to receive an electric current.

Said casing element is notable in that it comprises a pair of slots provided in a wall of the casing element, the pair of slots comprising a slot on either side of a reception area configured to house said electrical conductor, and said pair of slots being provided to allow the insertion of a part with a U-shaped section comprising a base and two arms parallel to one another and orthogonal to the base, said arms being configured to be inserted in said slots on either side of said reception area, so that the U-shaped part is able to guide a magnetic flux generated by an electric current circulating in said electrical conductor.

The casing element thereby enables the insertion of U-shaped magnetic parts in the pairs of slots to provide a focusing function of the magnetic fields induced by the currents circulating in the electrical conductor housed in the reception area, in order to provide a reliable measurement of the intensity of said currents by sensors, for example Hall effect sensors connected on a printed circuit board secured to the casing element.

The electrical conductor can be a strip made of an electrically-conducting material, for example copper, steel or aluminium. The strip is preferably folded. The electrical conductor comprises, in particular, a first end configured to be electrically connected to a component of the first electric equipment, for example an electronic power module, and a second end configured to be electrically connected to a second electric equipment, for example an electric device.

According to one embodiment, a U-shaped opening is provided in the wall between the slots of the pair of slots so as to form a tab comprising a protrusion and a degree of flexibility adapted to ensure a fixation clip function to hold the base of the U-shaped part inserted in the pair of slots.

According to one embodiment, said casing element is made of a single block.

The present invention also relates to an electric equipment comprising a casing element such as briefly described above, comprising at least one U-shaped part made of a magnetic material, comprising a base and two arms parallel to one another and orthogonal to the base, said arms being inserted in said slots on either side of the reception area, said U-shaped part being configured to guide a magnetic flux generated by a current circulating in the electrical conductor housed in the reception area.

According to one embodiment, the electric equipment comprises an electrical conductor mounted in the reception area, and in which the electrical conductor locks the U-shaped part.

Preferably, the flexibility of the tab is configured to enable the release of the U-shaped part by pressure applied on said tab in a direction opposite to the base of the U-shaped part.

According to one embodiment, the electrical conductor locks the U-shaped part by preventing the movement of the tab in a direction opposite to the base of the U-shaped part that is likely to cause the release of said U-shaped part.

According to one embodiment, a portion of the electrical conductor provides the locking function of the U-shaped part, said portion corresponding to a surface of said electrical conductor parallel to the wall and coming to bear against the tab, preventing all movement of the tab in a direction orthogonal to said wall and opposite to the base of said U-shaped part.

According to one embodiment, the wall forms an outer wall of the electric equipment and the electrical conductor comprises an end that forms an external electric terminal of the electric equipment and another end connected to an electric component included in said casing element, said U-shaped part being configured to guide a magnetic field produced by a current circulating in said electric conductor to perform a measurement of said current.

Advantageously, the electric equipment comprises a sensor, in particular a Hall effect sensor, located between the arms of the U-shaped part so as to measure a current circulating in the electrical conductor from a magnetic field guided by the U-shaped part.

Advantageously, the electric equipment comprises a printed circuit board mounted in said casing element, said sensor being mounted on the printed circuit board, and said printed circuit board comprising slots in which the arms of the U-shaped part are inserted.

According to one embodiment, the printed circuit board is perpendicular to the wall, and the arms of the U-shaped part are introduced into the slots following a direction that is parallel to the plane of said printed circuit board.

According to one aspect of the invention, the electrical conductor is secured to a terminal of a component of the first electric equipment, for example an electronic power module.

According to one embodiment, the electric equipment is an inverter provided to be electrically connected, on one hand, to an electric device of the vehicle and, on the other hand, to a high-voltage power battery of the vehicle.

According to one aspect of the invention, the inverter comprises an electronic power module able to convert a direct current into a plurality of alternating currents called "phase currents", said plurality of phase currents circulating between the electronic power module and the electric device of the vehicle through the plurality of electrical conductors.

The terms "electronic power module able to convert a direct current into a plurality of alternating currents" are used to describe the fact that the electronic power module can be configured to convert a direct current into a plurality of alternating currents and/or to convert a plurality of alternating currents into a direct current.

The invention also relates to an electric or hybrid vehicle comprising an electric device, for example a motorisation device, powered by a high-voltage power battery through an on-board high-voltage electrical system and an electric equipment, such as described above, connected to said electric device.

BRIEF PRESENTATION OF THE DRAWINGS

Figure 2:
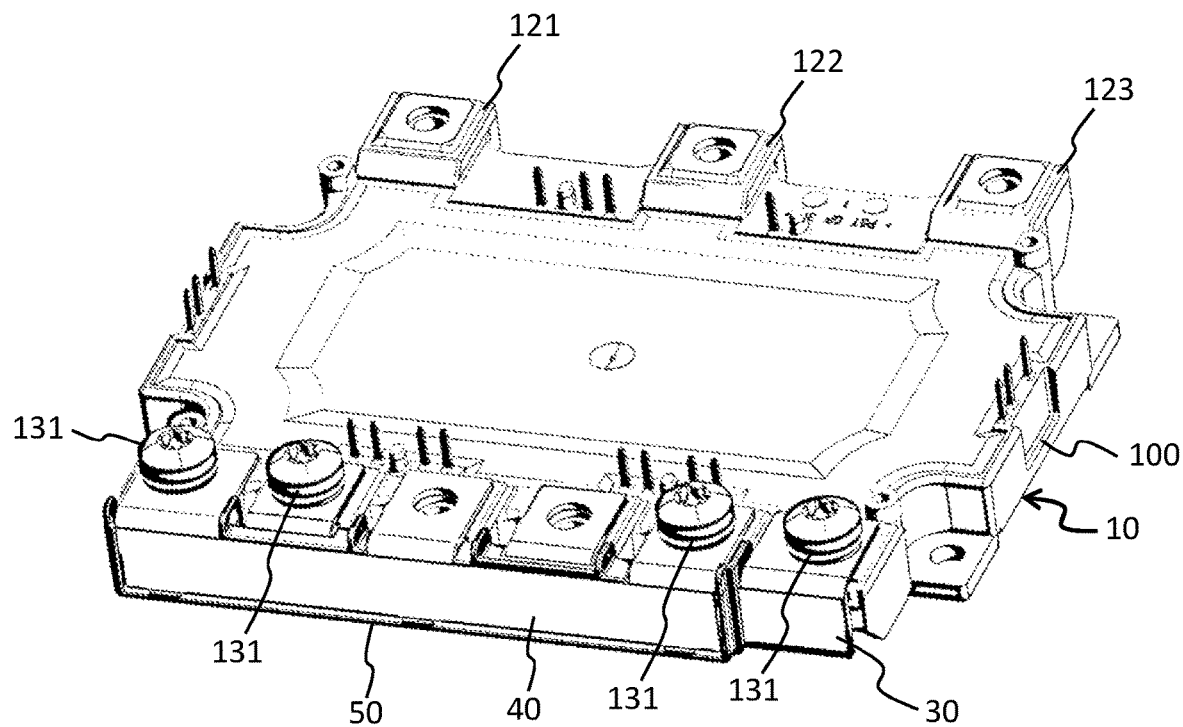
Figure 3:
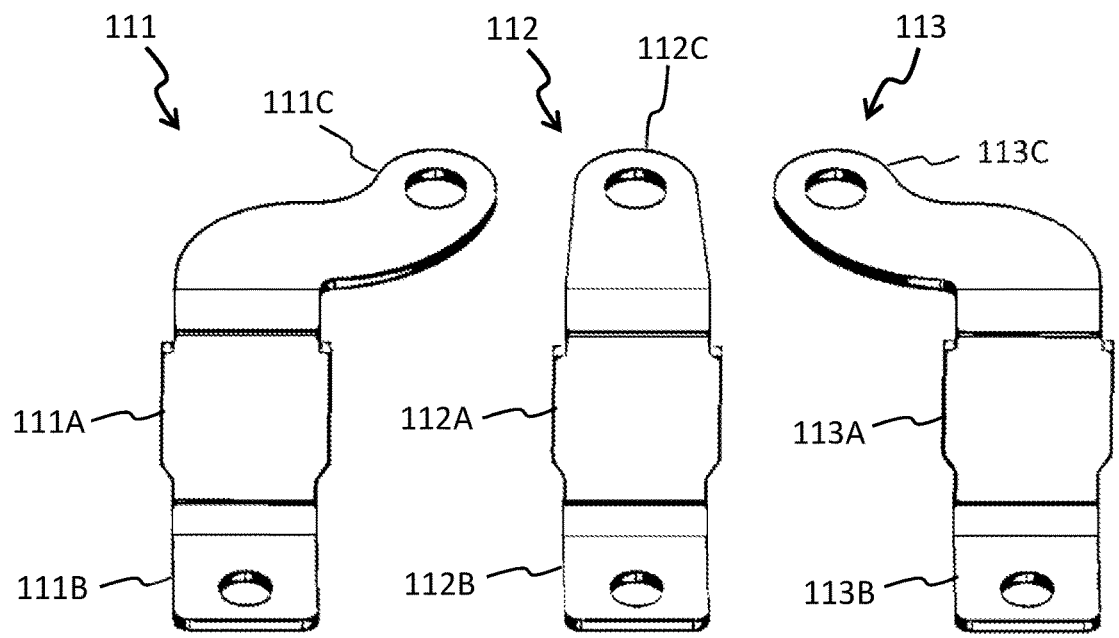
Figure 4:
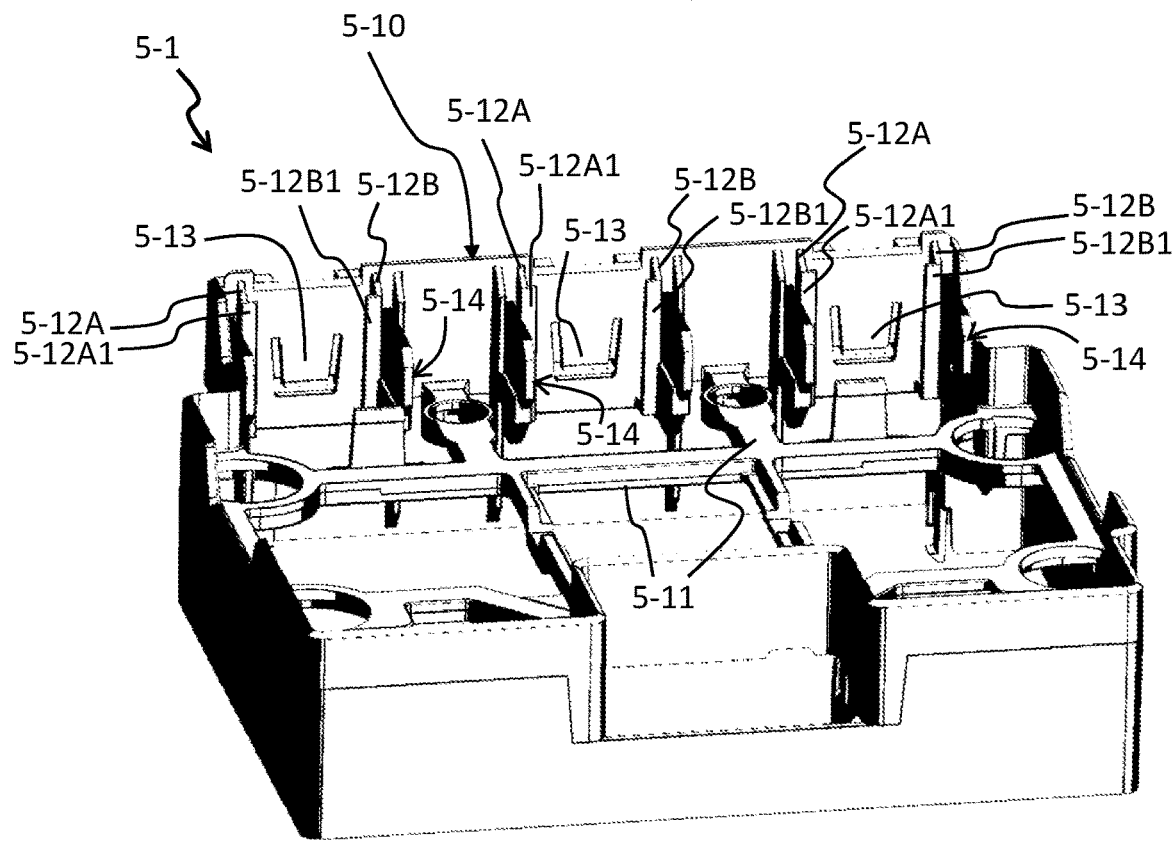
Figure 5:
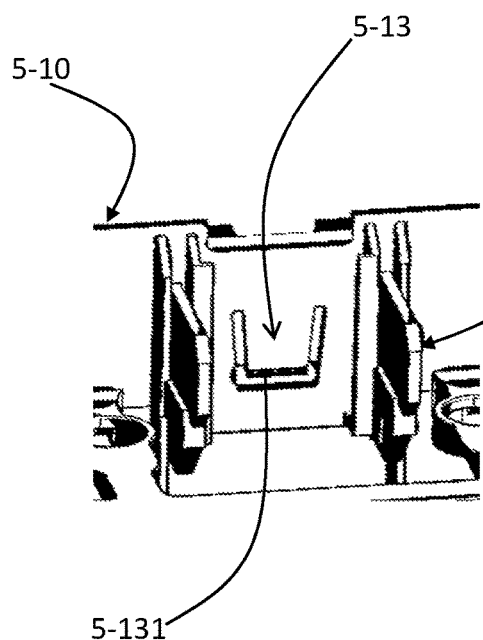
Figure 6:
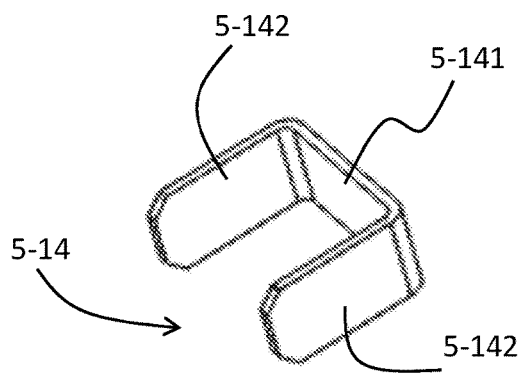
Figure 7:
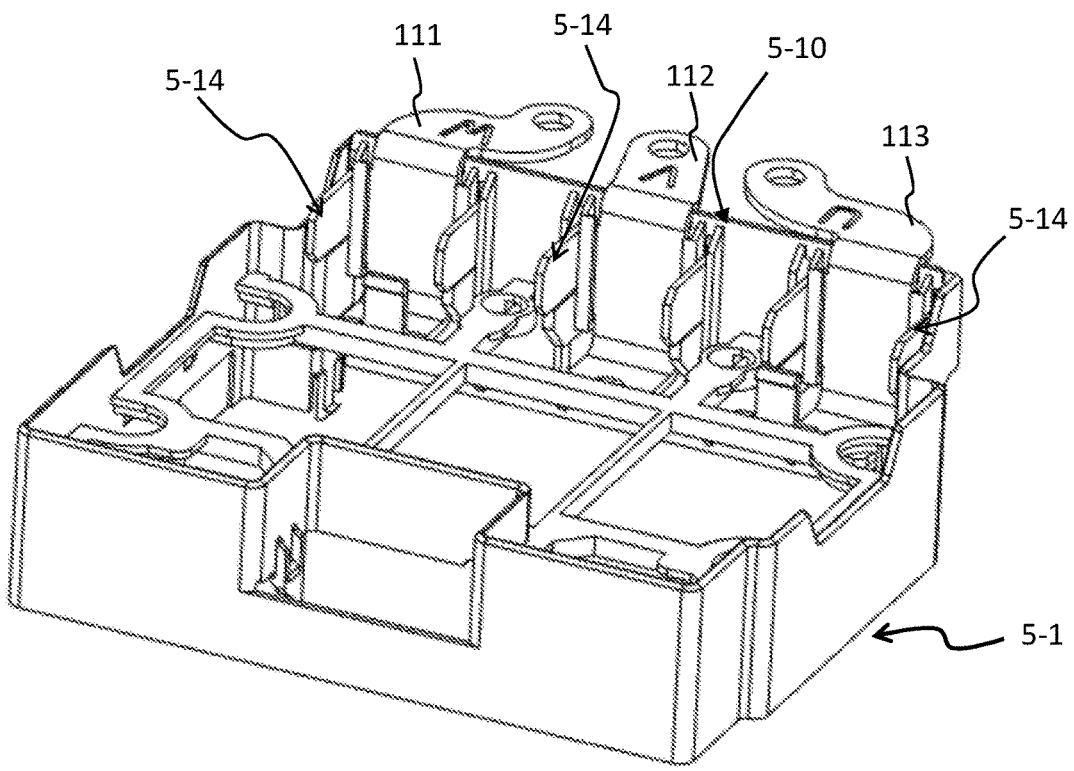
Figure 8:
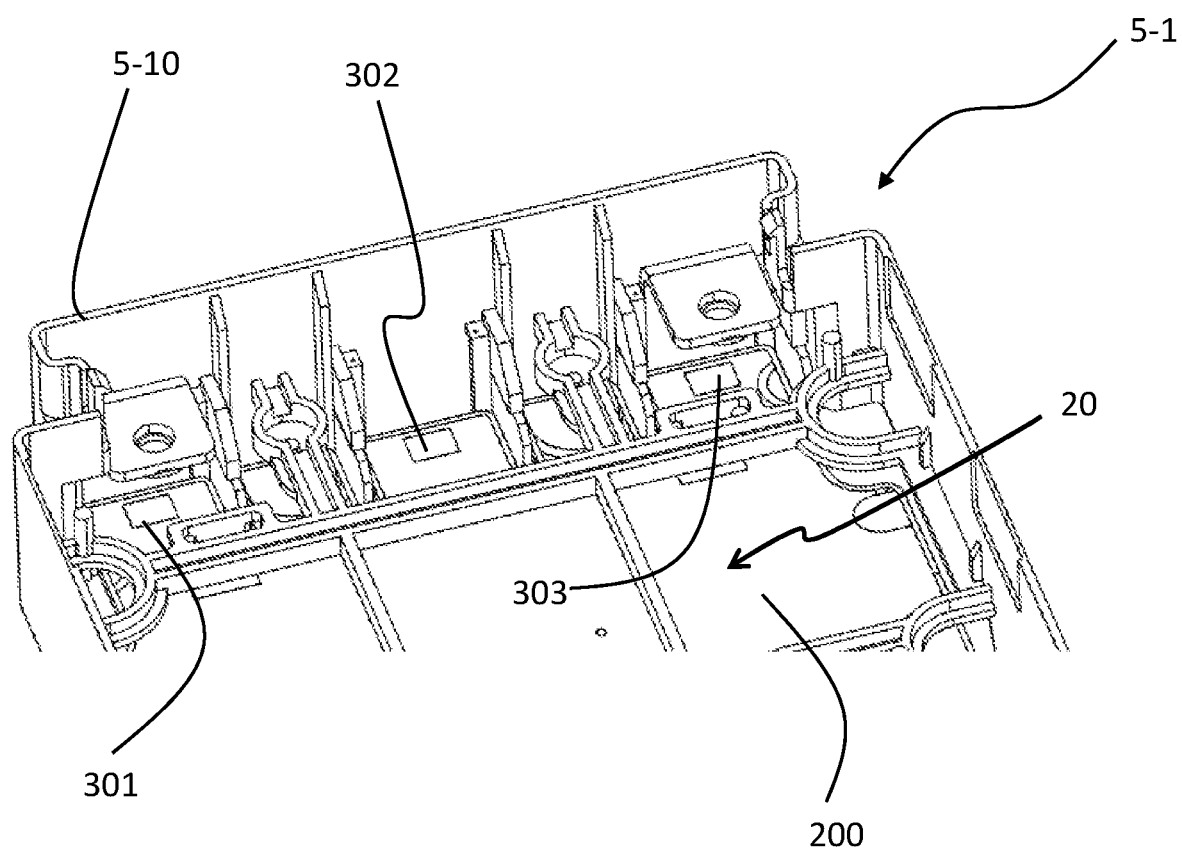

The invention will be better understood upon reading the following description, provided solely as an example, and with reference to the appended drawings, provided as examples and not limited thereto, wherein identical references are made to similar items and wherein:

FIG. 1 is a perspective view of an embodiment of an inverter according to the invention, FIG. 2 is a perspective view of the unit formed by the electronic module, the electronic control module, the first positive potential electrical conductor, the first negative potential electrical conductor, and the fixation bar of the inverter of FIG. 1, FIG. 3 is a perspective view of a set of electrical conductors, FIG. 4 is a perspective view of the casing element of the inverter of FIG. 1, comprising U-shaped parts, FIG. 5 is a partial and close-up view of the casing element of FIG. 4 showing the two arms of a U-shaped part and the tab retaining said U-shaped part, FIG. 6 is a perspective view of the U-shaped part shown alone, FIG. 7 is a perspective view of the casing element of FIG. 4 on which are mounted the electrical conductors of FIG. 3 and the U-shaped part of FIG. 6, FIG. 8 is a bottom view of the casing element according to the invention, in which a printed circuit board is arranged.

It should be noted that the figures provide a detailed view of the invention to illustrate its implementation, said figures can naturally also serve to better define the invention as necessary.

DETAILED DESCRIPTION

In the detailed description provided below, the invention is described in its application to an electric or hybrid automotive vehicle, without it being limiting in terms of the scope of the present invention.

In the example described below, the vehicle comprises in particular an electric device, an electric equipment in to form of an inverter, a high-voltage power battery, an on-board high voltage electrical system, a low-voltage power battery, an on-board low-voltage electrical system and a plurality of auxiliary electric equipment.

The electric equipment according to the invention is described below in its implementation for an inverter, without it limiting the scope of the present invention. It should therefore be noted that the electric equipment can be other than an inverter, for example a charger or a DCDC converter on board the vehicle The on-board low-voltage electrical system connects the low-voltage power battery to the plurality of auxiliary electric equipment so that the low-voltage power battery powers said auxiliary electric equipment, such as on-board computers, the window lift motors, the multimedia system etc. The low-voltage power battery typically delivers a voltage of around 12V, 24V or 48V. The charging of the low-voltage battery is conducted from the high-voltage battery through a direct voltage to direct voltage converter, commonly known as a direct-to-direct converter.

The on-board high-voltage electrical system connects the high-voltage power battery to the inverter so that the high-voltage power battery powers the electric device through the inverter. The high-voltage power battery typically supplies a voltage ranging from 100V to 900V, preferably from 100V to 500V. The electrical power charging of the high-voltage power battery is achieved by connecting it, through the direct high-voltage electrical system of the vehicle, to an external electricity grid, for example the domestic alternating electricity grid.

The electric device is a rotating electric device, preferably provided to drive the wheels of the vehicle using the power supplied by the high-voltage power battery. More specifically, the electric device is an alternating current electric device powered by a source of multiphase current. For example, the electric device can be an alternating current motor. In the preferred example described below, the electric device is powered by a source of three-phase currents, without this being limiting in terms of the scope of the present invention.

In this example, the control of the electric device is achieved by means of an inverter. Said inverter converts the direct current supplied by the high-voltage power battery into three alternating control currents, for example sinusoidal currents. In other words, the purpose of the inverter is to transform the incoming direct current delivered by the high-voltage power battery into three phase currents that enable to control the electric device. Inversely, in another operating mode, the electric device can also supply three alternating currents to the inverter, so that said inverter transforms them into a direct current that can be used to charge the high-voltage power battery.

In the example shown in FIG. 1, the inverter 1 comprises a casing 5 in which are mounted, with reference to FIG. 2, an electronic power module 10, an electronic control unit (partially shown in FIG. 8) and a plurality of electrical conductors 30, 40, 111, 112, 113. The electronic control unit 20 comprises components enabling to control the components of the electronic power module 10. More specifically, the electronic control unit 20 controls the electronic power module 10 so that it converts the direct current supplied by the high-voltage battery, defining a direct voltage from the first electrical conductor 30 and the second electrical conductor 40, into three alternating phase currents to control the motor (or inversely).

With reference to FIGS. 1 and 2, the electronic power module 10 comprises a body 100 on which are secured the electrical conductors 30, 40, 111, 112, 113. Furthermore, the electronic power module 10 comprises electronic power components through which the electric energy passes to power the electric device, in particular configured to convert the direct current to alternating currents or inversely. The electronic power components can comprise electronic switches, such as, for example, semiconductor transistors, arranged in an electric circuit to enable a controlled passage of the electric power from the high voltage power battery to the electric device. In particular, the electronic power components are bare semiconductor chips for which the body 100 provides an encapsulation. With reference to FIG. 2, the electronic power module 10 comprises three phase ports 121, 122, 123, each delivering a control phase current to the motor as well as a positive external electric terminal and a negative external electric terminal (not shown).

In the example shown in FIGS. 1 and 2, the inverter comprises a first electrical conductor 30 configured to electrically connect the inverter 1 to the positive potential of the high-voltage battery (not shown), a second electrical conductor 40 configured to connect electrically the inverter 1 to the negative potential of the high-voltage battery and three "phase" conductors 111, 112, 113 provided to electrically connect the inverter 1 to the electric device.

With reference to FIGS. 1 and 2, each electrical conductor 30, 40 is in the form of a strip on which extend fixation elements 301, 401 to the body 100 of the electronic power module 10 by means of a screw 131. As shown in FIG. 2, the inverter 1 further comprises an electrically-insulating fixation bar 50 separating the first electrical conductor 30 from the second electrical conductor 40, in particular to prevent short-circuits between the first electrical conductor 30 and the second electrical conductor 40. For this purpose, the fixation bar 50 is preferably made of a plastic material, such as, for example, PBT GF30.

Each phase conductor 111, 112, 113 enables the electrical connection of a phase of the electric device controlled by the inverter 1 to the electronic power module 10. It should be noted, in another embodiment, that the inverter 1 could comprise a different amount of phase conductors 111, 112, 113, in particular an amount based on the number of phases of the electric device controlled by the inverter 1.

Each phase connector 111, 112, 113 is mounted on the phase port 121, 122, 123 and is secured thereto, for example by means of a screw (not shown), welding, or another method. Each phase conductor 111, 112, 113 passes through an opening of the casing 5 to connect the inverter 1 to the electric device, and in particular to allow the circulation of alternating currents between the electronic power module 10 and the electric device.

With reference now to FIGS. 1, 3 and 7, each phase conductor 111, 112, 113 is in the form of a single-block part, i.e. made of a single part. This part is in the form of a strip formed in an electrically-conducting material.

The thickness of the phase conductors 111, 112, 113 can be chosen based on their required use and, in particular, on the intensity of the currents that travel through them. Advantageously, the thickness of the phase conductors 111, 112, 113 ranges from 0.5 to 3 mm. Preferably, the thickness of the phase conductors 111, 112, 113 is of around 1 mm, 1.5 mm or 2 mm. The phase conductors 111, 112, 113 can also, advantageously, be treated with an anti-wear surface coating, for example made of tin and/or nickel for the compatibility of the materials or to improve the electric current.

In the example shown in FIG. 3, each electrical conductor 111, 112, 113 comprises a central portion 111A, 112A, 113A from which extend perpendicularly but in the opposite direction a first fixation end 111B, 112B, 113B, and a second fixation end 111C, 112C, 113C. The first fixation end 111B, 112B, 113B is configured to be connected to a phase port 121, 122, 123 of the electronic power module 10, for example by means of a screw. For this purpose, the first fixation end 111B, 112B, 113B is in the form of a flat portion adapted to come into contact with a flat portion of a phase port 121, 122, 123. The second fixation end 111C, 112C, 113C is configured to be connected to a phase conductor (not shown) of the electric device. For this purpose, the second fixation end 111C, 112C, 113C is in the form of a flat portion adapted to come into contact with a flat portion of a phase conductor of the electric device.

It should be noted that in this non-limiting example, the second ends 111C, 113C of the phase conductors 111 and 113 are configured so as to come closer to the second end 112C of the phase conductor 112 positioned centrally, which is located in the extension of the central portion 112A of said central phase conductor 112. This results in bringing the second ends 111C, 112C, 113C of the phase conductors 111, 112, 113 closer, so that they can be connected with the corresponding phase conductors, arranged in a similar fashion, of the electric device. However, the second ends 111C, 112C, 113C can be formed differently, depending in particular on the environment in which the inverter 1 is to be mounted.

For this purpose, the electronic control unit 20 is in the form of a printed circuit board 200, as shown in FIG. 8. The printed circuit board 200 can be mounted on a wall of the casing 5 or a support element (not shown, but that can be, for example, a plate) suspended inside the housing defined by the casing 5. In particular, the electronic power module 10, the support element and the electronic control unit 20 can be superimposed in the housing defined by the casing 5, the support element then being between the electronic power module 10 and the electronic control unit 20. For example, such a support element can be placed in the casing 5 and maintained in position by bearing against portions of material of said casing 5, in particular outgrowths from the surface of the casing 5. The support can in particular be held in place by being supported at its periphery. This support element can for example be made of metal to improve the heat dissipation of the electronic control unit 20. The electronic control unit 20 can be configured to exchange, through signal connectors 5-31, 5-32 shown in FIG. 1, data signals with the exterior of the inverter 1, for example with a controller of the vehicle.

With reference to FIG. 8, current sensors 301, 302, 303, provided to perform measurements of the intensity of the current circulating in the phase conductors 111, 112, 113, are for example mounted on the surface of the printed circuit board 200 of the electronic control unit 20. In particular, each current sensor 301, 302, 303 is able to measure the current from the magnetic field generated by each phase conductor 111, 112, 113 due to the passage of current. The current sensors 301, 302, 303 are, for example, Hall effect sensors. Each current sensor 301, 302, 303 can comprise pins that are inserted into the printed circuit board 200 of the electronic control unit 20 to which they transmit the measured value.

U-shaped parts 5-14 made of a magnetic material, shown in FIG. 4, are configured to provide a focusing function of the magnetic fields induced by the currents circulating in each phase conductor 111, 112, 113 to enable said sensor 301, 302, 303, in particular Hall effect sensors, to perform reliable measurements of the intensity of said currents circulating in the phase conductors 111, 112, 113. In other words, the U-shaped parts 5-14 are configured to guide the magnetic flux generated by the current circulating in each phase conductor 111, 112, 113, so as to focus said magnetic flux towards the sensor, in particular a Hall effect sensor 301, 302, 303, to provide a reliable measurement of the intensity of the current circulating in said phase conductor 111, 112, 113.

According to one embodiment wherein the current sensors 301, 302, 303 are mounted on the printed circuit board 200, said printed circuit board 200 comprises slots into which the arms 5-142 of the U-shaped part 5-14 are inserted. Therefore, the arms 5-142 of the U-shaped part 5-14 are as close as possible to the corresponding sensor 301,302, 303 mounted on the printed circuit board 200.

In particular, the printed circuit board 200 is perpendicular to the wall 5-10 of the casing element 5-1, and the arms 5-142 of the U-shaped part 5-14 are inserted in said slots in a direction parallel to the plane of said circuit board 200.

As shown in FIG. 1, the casing 5 comprises a casing element 5-1 and a cover 5-2, mounted on the element of the casing 5. The casing 5 also comprises a bottom (not visible in FIG. 1) that extends under the casing element 5-1. In the example shown in FIG. 1, the inverter 1 further comprises, in a non-limiting manner, two signal connectors 5-31, 5-32, described above, and a power connector 5-4 configured to connect the inverter 1 to an electric power cable, said connectors being mounted on the cover 5-2 of the casing 5.

With reference now to FIG. 4, the casing element 5-1 is in the form of a single-piece part made by moulding a plastic material. The casing element 5-1 comprises a side wall 5-10 in the form of a U-shaped belt and support elements 5-11 configured to support the electronic power module 10 and the electronic control unit 20. The support elements 5-11 comprise for example hooks to secure the body 100 of the electronic power module 10.

The casing element 5-1 comprises reception members 5-12A, 5-12B, enabling to immobilise, for example by force fitting, the phase conductors 111, 112, 113. As shown in FIG. 4, these reception members are formed from the material of the side wall 5-10 and comprise three pairs of walls, each adapted to house a phase conductor 111, 112, 113.

More specifically, each pair of walls comprises a first wall 5-12A, and a second wall 5-12B that extend parallel to one another and perpendicular to the side wall 5-10 so as to immobilise a phase conductor 111, 112, 113. In this example, the first wall 5-12A and the second wall 5-12B of each pair of walls 5-12A, 5-12B extend substantially over the entire height of the side wall 5-10.

Preferably, each one of the first wall 5-12A and of the second wall 5-12B of each pair of walls 5-12A, 5-12B comprises at least one gadroon. This gadroon forms an excess material thickness to help adjust the insertion between each pair of walls 5-12A, 5-126 and the corresponding phase conductor 111, 112, 113 so as to immobilise them efficiently one in the other. In this example, the gadroons are formed from the material of the first wall 5-12A and of the second wall 5-12B of each pair of walls 5-12A, 5-12B.

Still in the shown example, the first wall 5-12A comprises an abutment portion 5-12A1, that extends in parallel to the side wall 5-10 in the direction of the second wall 5-12B, and the second wall 5-12B comprises an abutment portion 5-1261, that extends in parallel to the side wall 5-10 in the direction of the first wall 5-12A.

Still with reference to FIG. 4, the casing element 5-1 comprises slots into which are inserted the parts 5-14 that have a U-shaped section. A pair of slots is provided on either side of each reception member 5-12A, 5-12B of a phase conductor 111, 112, 113.

The parts 5-14, that comprise a U-shaped section are provided for magnetic field focusing purposes. These U-shaped parts 5-14 are manufactured by moulding, separately, so as to ensure the orientation of the molecules in the material configured to enable an efficient focusing function of the magnetic field with respect to the magnetic fields generated by the currents circulating in the phase conductors 111, 112, 113.

With reference to FIG. 6, each U-shaped part 5-14 comprises a flat base 5-141 and two flat arms 5-142, parallel to one another and orthogonal to the base, configured to be inserted in the slots of a pair of slots, so that said arms are on either side of a reception member of a phase conductor 111, 112, 113, the flat base of the U-shaped part coming to bear against the side wall 5-10, from the outside of the casing element.

With reference to FIG. 5, between two slots, an opening is provided in the side wall 5-10 to form a flexible tab 5-13 comprising a protrusion 5-131. The protrusion serves as a mounting clip configured to cooperate with the flat base of the U-shaped shield so as to retain said U-shaped part against the casing element.

On another side, the phase conductors 111, 112, 113, once inserted in the casing element 5 and housed by their respective reception member 5-12A, 5-12B, come to bear, through their central portion 111A, 112A, 113A, against the side wall 5-10 and therefore against the flexible tab 5-13, thereby locking the U-shaped part by preventing all movement of said flexible tab 5-13 in the opposite direction to the base of the "U", preventing the release of said U-shaped part 5-14.

During the assembly of the inverter, the electronic power module 10 and the electronic control unit 20 are assembled first.

The U-shaped parts 5-14 are then inserted in the casing element 5-1 by inserting the flat arms 5-142 in the slots provided for that purpose.

The flexible tab 5-13 features a protrusion that ensures the fixation by clipping of each U-shaped part 5-14.

Each phase conductor 111, 112, 113 is then inserted, for example by force fitting, by sliding it between each pair of walls 5-12A, 5-12B. The phase conductors 111, 112, 113 are for example blocked by the gadroons between the first wall 5-12A and the second wall 5-12B.

FIG. 7 shows a casing element 5-1 in which three U-shaped parts 5-14 and three phase conductors 111, 112, 113 have been inserted.

Then, each phase conductor 111, 112, 113 is screwed to the corresponding phase port 121, 122, 123 so as to connect it electrically to the phase ports 121, 122, 123 of the electronic power module 10.

The abutment portions of each pair of walls 5-12A, 5-12B further enable to maintain the phase conductors 111, 112, 113 between the first wall 5-12A and the second wall 5-12B of each pair of walls 5-12A, 5-12B.

Through their central portion 111A, 112A, 113A that comes to bear against the flexible tab 5-13, each phase conductor 111, 112, 113 forms an abutment that prevents all movement of the flexible tab 5-13 in a direction opposite the flat base portion 141 of each U-shaped part 5-14. Therefore, the U-shaped parts 5-14 are locked into position and can no longer be released as long as the corresponding phase conductor 111, 112, 113 is present opposite to the flexible tab 5-13.

The cover 5-2 and the bottom of the casing 5 can then be secured to the casing element 5-1 so as to close the casing and, for example, to seal the inverter 1. The phase conductors 111, 112, 113 of the inverter 1 can then be electrically connected to the electric device and the positive and negative potential electrical conductors 30, 40 can be connected to the high-voltage battery of the vehicle.

The invention is not limited to the example described above. The figures show a specific embodiment example that combines several embodiments. However, the features of each embodiment can be independent from one another in various modes, or they can be combined, as shown in the claims.

The invention claimed is:

1. An electric equipment comprising a casing element, said casing element being configured to house at least one electrical conductor configured to receive an electric current,
said casing element comprising a pair of slots provided in a wall of the casing element, the pair of slots comprising a slot on either side of a reception area configured to house said electrical conductor, and said pair of slots being provided to allow the insertion of a part with a U-shaped section comprising a base and two arms parallel to one another and orthogonal to the base, said arms being configured to be inserted in said slots on either side of said reception area, so that the U-shaped part is able to guide a magnetic flux generated by an electric current circulating in said electrical conductor, the electric equipment further comprising:
at least one U-shaped part made of a magnetic material, with a base and two arms parallel to one another and orthogonal to the base, said arms being inserted in said slots on either side of the reception area, said U-shaped part being configured to guide a magnetic flux generated by a current circulating in the electrical conductor housed in the reception area,
an electrical conductor mounted in the reception area, wherein the electrical conductor locks the U-shaped part,
wherein the wall forms an outer wall of the electric equipment and the electrical conductor comprises an end that forms an external electric terminal of the electric equipment and another end connected to an electric component included in said casing element, said U-shaped part being configured to guide a magnetic field produced by a current circulating in said electric conductor to perform a measurement of said current.

2. The electric equipment according to claim 1, comprising a U-shaped opening provided in the wall between the slots of the pair of slots so as to form a tab, said tab comprising a protrusion and a degree of flexibility adapted to ensure a fixation clip function to hold the base of the U-shaped part inserted in the pair of slots.

3. The electric equipment according to claim 2, comprising the casing element according to claim 2, wherein the flexibility of the tab is configured to allow the release of the U-shaped part by pressure applied on said tab in a direction opposite to the base of the U-shaped part.

4. The electric equipment according to claim 3, wherein the electrical conductor locks the U-shaped part by preventing the movement of the tab in a direction opposite to the base of the U-shaped part that is likely to cause the release of said U-shaped part.

5. The electric equipment according to claim 4, wherein a portion of the electrical conductor provides the locking function of the U-shaped part, said portion corresponding to a surface of said electrical conductor parallel to the wall and coming to bear against the tab, preventing all movement of the tab in a direction orthogonal to said wall and opposite to the base of said U-shaped part.

6. The electric equipment according to claim 1, comprising a sensor, in particular a Hall effect sensor, located between the arms of the U-shaped part so as to measure a current circulating in the electrical conductor from a magnetic field guided by the U shaped part.

7. The electric equipment according to claim 1, comprising a printed circuit board mounted in said casing element, said sensor being mounted on the printed circuit board, and said printed circuit board comprising slots in which the arms of the U-shaped part are inserted.

8. The electric equipment according to claim 6, wherein the printed circuit board is perpendicular to the wall, and the arms of the U-shaped part are introduced into the slots following a direction that is parallel to the plane of said printed circuit board.

\* \* \* \* \*